United States Patent
Lee et al.

(10) Patent No.: US 8,502,297 B2
(45) Date of Patent: Aug. 6, 2013

(54) NON-VOLATILE MEMORY AND FABRICATING METHOD THEREOF

(75) Inventors: Ya-Jui Lee, Taichung (TW); Ying-Chia Lin, Hsinchu (TW)

(73) Assignee: Powerchip Technology Corporation, Hsinchu (TW)

( * ) Notice: Subject to any disclaimer, the term of this patent is extended or adjusted under 35 U.S.C. 154(b) by 31 days.

(21) Appl. No.: 13/032,621

(22) Filed: Feb. 22, 2011

(65) Prior Publication Data
US 2012/0161221 A1    Jun. 28, 2012

(30) Foreign Application Priority Data
Dec. 22, 2010    (TW) ................. 99145267 A

(51) Int. Cl.
*H01L 29/788*    (2006.01)
(52) U.S. Cl.
USPC ...................................... 257/316; 257/E29.3
(58) Field of Classification Search
None
See application file for complete search history.

(56) References Cited

U.S. PATENT DOCUMENTS

| | | | | | |
|---|---|---|---|---|---|
| 5,981,335 | A | * | 11/1999 | Chi | 438/253 |
| 6,103,573 | A | * | 8/2000 | Harari et al. | 438/257 |
| 6,297,097 | B1 | * | 10/2001 | Jeong | 438/264 |
| 6,908,817 | B2 | * | 6/2005 | Yuan | 438/264 |
| 7,026,684 | B2 | * | 4/2006 | Sakuma et al. | 257/315 |
| 7,170,131 | B2 | * | 1/2007 | Yuan | 257/321 |
| 7,517,756 | B2 | * | 4/2009 | Yuan | 438/257 |
| 7,847,333 | B2 | * | 12/2010 | Kuo et al. | 257/315 |
| 2008/0173925 | A1 | * | 7/2008 | Kuo et al. | 257/315 |

* cited by examiner

*Primary Examiner* — Thomas L Dickey
*Assistant Examiner* — Joseph Schoenholtz
(74) *Attorney, Agent, or Firm* — Jianq Chyun IP Office

(57) ABSTRACT

A non-volatile memory having a tunneling dielectric layer, a floating gate, a control gate, an inter-gate dielectric layer and a first doping region and a second doping region is provided. The tunneling dielectric layer is disposed on a substrate. The floating gate is disposed on the tunneling dielectric layer, and has a protruding portion. The control gate is disposed over the floating gate to cover and surround the protruding portion. The protruding portion of the floating gate is fully covered and surrounded by the control gate in any direction, including extending directions of bit lines, word lines and an included angle formed between the word line and the bit line. The inter-gate dielectric layer is disposed between the floating gate and the control gate. The first doping region and the second doping region are respectively disposed in the substrate at two sides of the control gate.

5 Claims, 8 Drawing Sheets

NON-VOLATILE MEMORY AND FABRICATING METHOD THEREOF

CROSS-REFERENCE TO RELATED APPLICATION

This application claims the priority benefit of Taiwan application serial no. 99145267, filed on Dec. 22, 2010. The entirety of the above-mentioned patent application is hereby incorporated by reference herein and made a part of this specification.

BACKGROUND OF THE INVENTION

1. Field of the Invention

The invention relates to a semiconductor device and a fabricating method thereof. More particularly, the invention relates to a non-volatile memory and a fabricating method thereof.

2. Description of Related Art

Non-volatile memory is a kind of memory having the advantages that it allows multiple data storing, reading or erasing operations. The data stored in the non-volatile memory will be retained even if the power applied to the device is cut off. The non-volatile memory has become a widely adopted memory device in personal computers and electronic equipments.

A typical non-volatile memory device is a stacked gate structure constituted by a floating gate and a control gate manufactured by doped polysilicon. The floating gate is disposed between the control gate and the substrate, and is floating instead of being connected to any circuit. The control gate is connected to a word line. Besides, a tunneling oxide layer is disposed between the substrate and the floating gate while an inter-gate dielectric layer is disposed between the floating gate and the control gate.

As the level of integration of the device increases currently, the size of the device is minimized based on the design rule. Generally, the larger a gate coupling ratio (GCR) between the floating gate and the control gate is, the lower the required working voltage for operation will be. The methods of increasing the gate coupling ratio include increasing the capacitance of the inter-gate dielectric layer or reducing the capacitance of the tunneling oxide layer. The principle method for increasing the capacitance of the inter-gate dielectric layer includes increasing the overlapped area between the control gate and the floating gate. However, as the integration of the device becomes higher, it is difficult to increase the overlapped area between the control gate and the floating gate in the conventional stacked gate structure, and therefore the issue of increasing the GCR and increasing the device integration remains.

SUMMARY OF THE INVENTION

Accordingly, the invention provides a non-volatile memory and a fabricating method thereof, so as to increase the overlapped area between the floating gate and the control gate, to enhance the GCR, to improve device performance, and to significantly reduce the interference between the floating gates.

The invention provides a non-volatile memory having a tunneling dielectric layer, a floating gate, a control gate, an inter-gate dielectric layer and a first doping region and a second doping region. The tunneling dielectric layer is disposed on a substrate. The floating gate is disposed on the tunneling dielectric layer, wherein the floating gate has a protruding portion. The control gate is disposed above the floating gate to cover and surround the protruding portion. The protruding portion of the floating gate is fully covered and surrounded by the control gate in any direction, such as an extending direction of a bit line, an extending direction of a word line and an extending direction of an included angle formed between a word line and a bit line. The inter-gate dielectric layer is disposed between the floating gate and the control gate. The first doping region and the second doping region are respectively disposed in the substrate at two sides of the control gate.

According to an embodiment of the invention, the protruding portion is shaped as a hillock or a pyramid.

According to an embodiment of the invention, a material of the inter-gate dielectric layer includes silicon oxide/silicon nitride/silicon oxide.

According to an embodiment of the invention, a material of the floating gate includes doped polysilicon.

According to an embodiment of the invention, a material of the control gate includes doped polysilicon or polycide.

According to an embodiment of the invention, a material of the tunneling dielectric layer includes silicon oxide.

In the non-volatile memory of the invention, the floating gate has the protruding portion, and the control gate covers and surrounds the protruding portion.

In addition, the protruding portion of the floating gate is fully covered and surrounded by the control gate in any direction, such as an extending direction of a bit line, an extending direction of a word line and an extending direction of an included angle formed between a word line and a bit line. Therefore, the overlapped area between the floating gate and the control gate is increased to enhance the GCR of the memory. Generally, the higher the gate coupling ratio is, the lower operation voltage of the memory needs, thereby increasing the efficiency of the device. Furthermore, the protruding portion of the floating gate is surrounded by the control gate, so as to reduce the interference between the adjacent floating gates.

The invention further provides a fabricating method of a non-volatile memory. The fabricating method includes following steps. A substrate is provided, and a tunneling dielectric layer and a first conductive layer are sequentially formed on the substrate. A plurality of isolation structures is formed in the first conductive layer, the tunneling dielectric layer and the substrate. Then, the first conductive layer is patterned to form a plurality of protruding portions. A portion of the isolation structures is removed, so that a top surface of each of the isolation structures is disposed between a top surface of the first conductive layer and a surface of the substrate. An inter-gate dielectric layer is formed on the substrate, and a second conductive layer is formed on the inter-gate dielectric layer. A patterning process is performed on the second conductive layer, the inter-gate dielectric layer and the first conductive layer. Thus, the second conductive layer is patterned to form a plurality of control gates, and the first conductive layer is patterned to form a plurality of floating gates. The protruding portion of each of the floating gates is fully covered and surrounded by the control gate in any direction, such as an extending direction of a bit line, an extending direction of a word line and an extending direction of an included angle formed between a word line and a bit line.

According to an embodiment of the invention, the method further includes a step of removing a portion of the first conductive layer to increase a distance between the adjacent protruding portions, after the step of patterning the first conductive layer to form the protruding portions.

According to an embodiment of the invention, the step of removing the portion of the first conductive layer to increase the distance between the adjacent protruding portions includes performing a wet etching process or a dry etching process.

According to an embodiment of the invention, the step of removing the portion of the first conductive layer to increase the distance between the adjacent protruding portions includes following steps. A portion of the first conductive layer is oxidized to form an oxidized layer. Then, the oxidized layer is removed.

According to an embodiment of the invention, the protruding portion is shaped as a hillock or a pyramid.

According to an embodiment of the invention, a material of the inter-gate dielectric layer includes silicon oxide/silicon nitride/silicon oxide.

According to an embodiment of the invention, a material of the floating gates includes doped polysilicon.

According to an embodiment of the invention, a material of the control gates includes doped polysilicon or polycide.

According to an embodiment of the invention, a material of the tunneling dielectric layer includes silicon oxide.

In the fabricating method of a non-volatile memory of the invention, the floating gate having the protruding portion is formed. The protruding portion of the floating gate is fully covered and surrounded by the control gate in any direction, such as an extending direction of a bit line, an extending direction of a word line and an extending direction of an included angle formed between a word line and a bit line. In other words, the protruding portion of the floating gate is covered and surrounded by the control gate in all directions. Therefore, the overlapped area between the floating gate and the control gate is increased to enhance the GCR of the memory. Accordingly, the lower operation voltage of the memory is required as the gate coupling ratio is increased, and thus the efficiency of the device is increased.

In the fabricating method of a non-volatile memory of the invention, the mask used to form the conductive layer having the protruding portions adapts the same mask for the subsequent formed control gates (word lines), so that additional masks are not required and the manufacturing cost is reduced.

In order to make the aforementioned and other features and advantages of the invention more comprehensible, embodiments accompanying figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
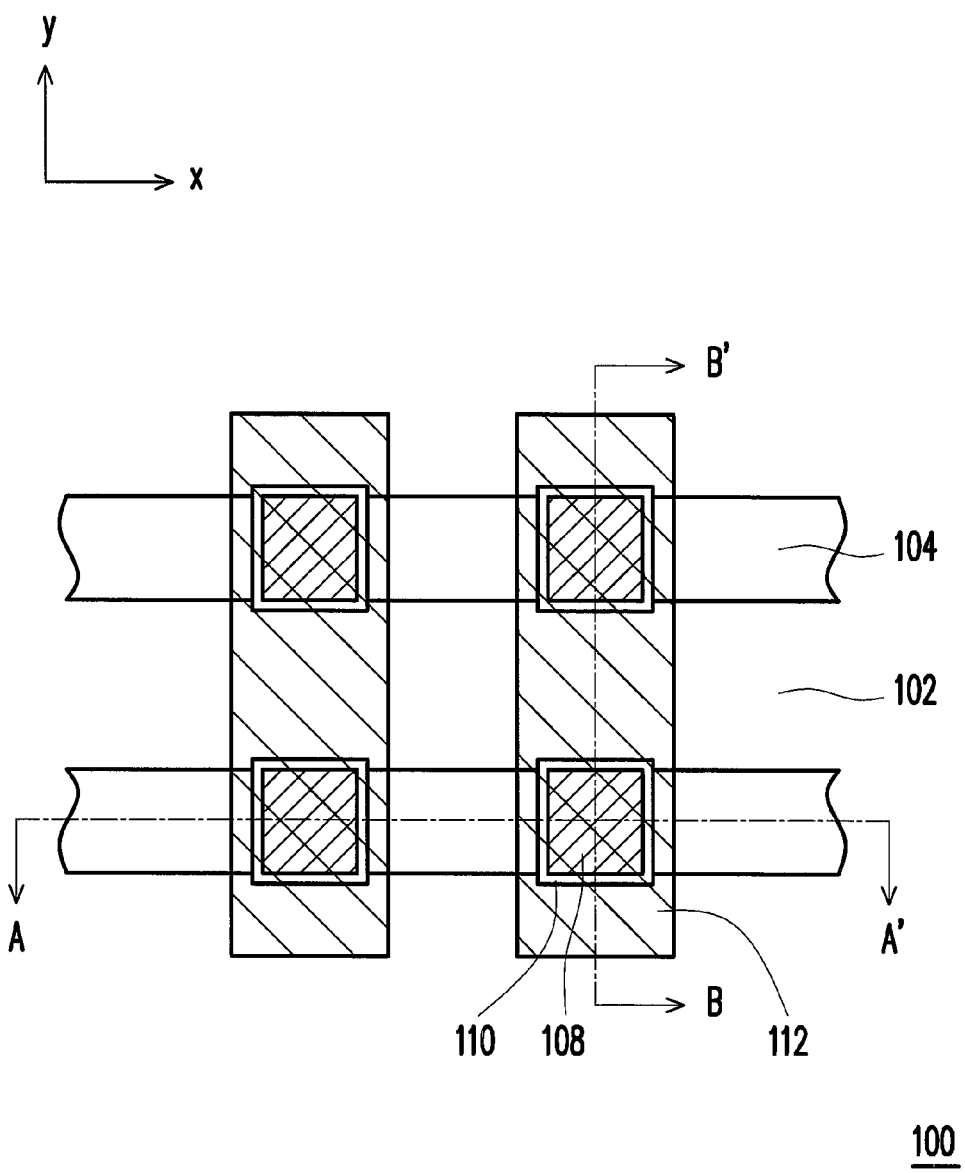
FIG. 1A shows a top view of a non-volatile memory according to an embodiment of the invention.
Figure 1B:
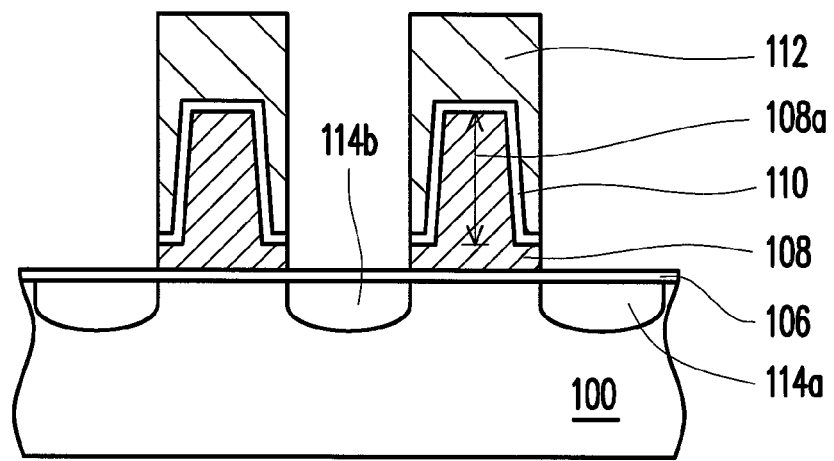
FIG. 1B is a cross-sectional view taken along a line A-A' depicted in FIG. 1A.
Figure 1C:
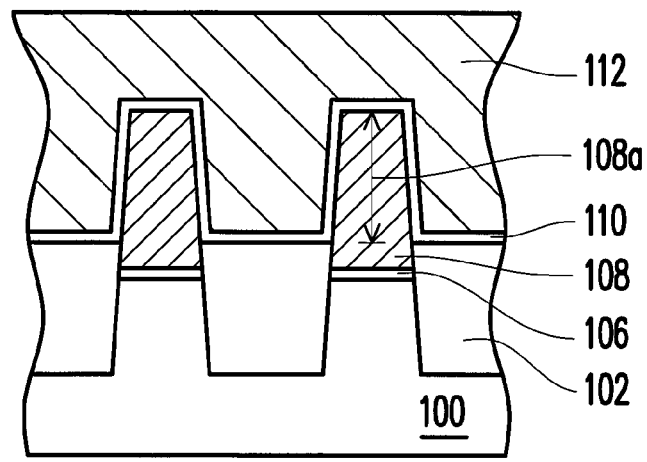
FIG. 1C is a cross-sectional view taken along a line B-B' depicted in FIG. 1A.

FIG. 1A shows a top view of a non-volatile memory according to an embodiment of the invention. FIG. 1B is a cross-sectional view taken along a line A-A' depicted in FIG. 1A. FIG. 1C is a cross-sectional view taken along a line B-B' depicted in FIG. 1A. The line A-A' is a cutting line along the active region, and the line B-B' is a cutting line along the word line.

Referring to FIGS. 1A to 1C, the non-volatile memory is disposed on a substrate 100, for example. The non-volatile memory includes isolation structures 102, control gates (word lines) 112, floating gates 108, a tunneling dielectric layer 106, an inter-gate dielectric layer 110 and a plurality of doping regions 114a, 114b.

The isolation structures 102 are disposed in parallel in the substrate 100 to define an active regions 104, for example. The isolation structures 102 can extend in an X direction. The isolation structures 102 can be shallow trench isolation structures.

The control gates (word lines) 112 are arranged on the substrate 100 in parallel and extend in a Y direction, for example. The Y direction intersects the X direction. A material of the control gates (word lines) 112 is a conductive material, such as doped polysilicon and polysilicide.

The floating gates 108 are disposed under the control gates 112 and located on the active region 104 between the adjacent two isolation structures 102. Each of the floating gates 108 has a protruding portion 108a, and the protruding portion 108a of the floating gate 108 is fully covered and surrounded by the control gate 112 in any direction, such as an extending direction of the line A-A', an extending direction of the line B-B' or an extending direction of an included angle formed between the line A-A' and the line B-B'. In other words, the protruding portion 108a of the floating gate 108 is covered and surrounded by the control gate 112 in all directions. The protruding portion 108a can be shaped as a hillock or a pyramid. A material of the floating gates 108 is a conductive material, such as doped polysilicon and polysilicide.

The tunneling dielectric layer 106 is disposed between each floating gate 108 and the substrate 100, for example. A material of the tunneling dielectric layer 106 is silicon oxide or other appropriate dielectric materials.

The inter-gate dielectric layer 110 is disposed between each control gate 112 and each floating gate 108, for example. A material of the inter-gate dielectric layer 110 can be silicon oxide, silicon nitride or a composite dielectric layer, such as silicon oxide/silicon nitride/silicon oxide.

The doping regions 114a, 114b are disposed in the substrate 100 at two sides of the control gate 112, for example. The doping regions 114a, 114b are P-type or N-type doping regions. In the present embodiment, the control gate 112 serves as the word line of the memory.

As shown in FIGS. 1A to 1C, in the non-volatile memory according to an embodiment of the invention, the floating gate 108 has the protruding portion 108a, and the protruding portion 108a of the floating gate 108 is fully covered and surrounded by the control gate 112 in any direction, such as an extending direction of the line A-A', an extending direction of the line B-B' or an extending direction of an included angle formed between the line A-A' and the line B-B'. In other words, the protruding portion 108a of the floating gate 108 is covered and surrounded by the control gate 112 in all directions. Therefore, the overlapped area between the floating gate 108 and the control gate 112, including the area of the four side walls and the area of the top portion of the protruding portion 108a in the floating gate 108, is increased to enhance the GCR of the memory. Accordingly, the lower operation voltage of the memory is required as the gate coupling ratio is increased, and thus the efficiency of the device is increased. In addition, the protruding portion 108a of the floating gate 108 is further covered and surrounded by the inter-gate dielectric layer 110. In the present embodiment, since the protruding portion 108a of the floating gate 108 is covered and surrounded by the control gate 112 in all directions, the coupling between the adjacent floating gates in any direction, such as FGx coupling, FGy coupling or FGxy coupling in an X direction, a Y direction or an XY direction respectively, is reduced.

Herein, a fabricating method of a non-volatile memory according to an embodiment of the invention is described in the following. FIGS. 2A to 2E are respectively schematic cross-sectional views taken along a line A-A' depicted in FIG. 1A. FIGS. 3A to 3E are respectively schematic cross-sectional views taken along a line B-B' depicted in FIG. 1A. In FIGS. 2A to 2E and FIGS. 3A to 3E, components identical to the ones in FIGS. 1A to 1C are labeled identically.

Figure 2A:
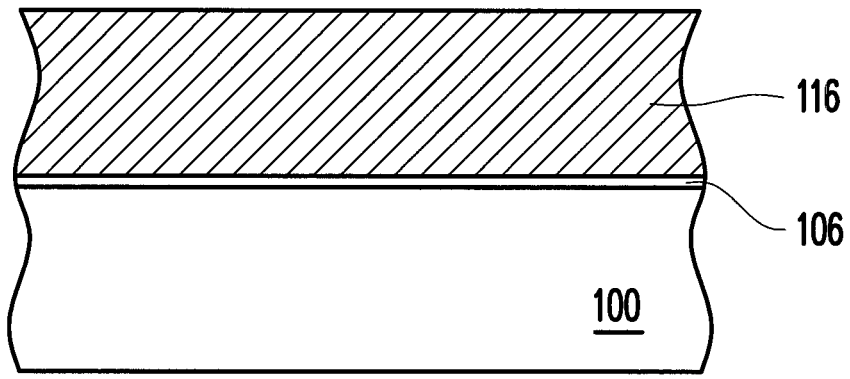
FIGS. 2A to 2E are schematic cross-sectional views taken along a line A-A' depicted in FIG. 1A and showing a fabricating method of a non-volatile memory according to an embodiment of the invention.
Figure 3A:
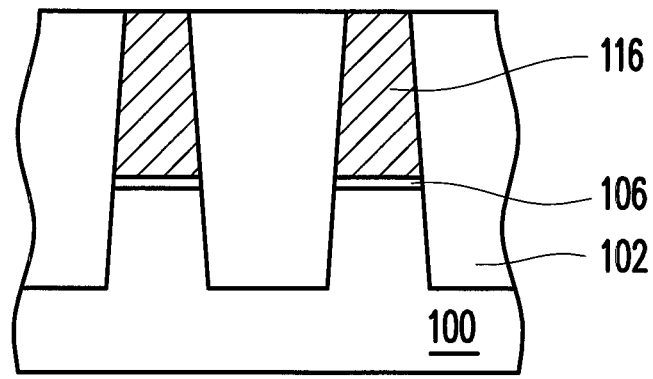
FIGS. 3A to 3E are schematic cross-sectional views taken along a line B-B' depicted in FIG. 1A and showing a fabricating method of a non-volatile memory according to an embodiment of the invention.

Referring to FIGS. 2A and 3A, first, a substrate 100 is provided. The substrate 100 is a silicon substrate, for example. A tunneling dielectric layer 106 and a conductive layer 116 are sequentially formed on the substrate 100. A material of the tunneling dielectric layer 106 is silicon oxide, for example. A method of forming the tunneling dielectric layer 106 includes performing a thermal oxidation process. A material of the conductive layer 116 is doped polysilicon. A method of forming the conductive layer 116 includes performing an ion implantation process after one undoped polysilicon layer (not shown) is formed by a chemical vapor deposition (CVD) process, or the conductive layer 116 can be formed by adopting the in-situ implanting operation in the CVD process. Thereafter, a plurality of isolation structures 102 is formed in the conductive layer 116, the tunneling dielectric layer 106 and the substrate 100, and the isolation structures 102 define an active region 104.

The isolation structures 102 extend in an X direction, for example. The isolation structures 102 can be shallow trench isolation (STI) structures, and a method of forming the isolation structures 102 includes forming a mask layer (not shown) on the conductive layer 116 and patterning the mask layer to form openings (not shown) which expose the conductive layer 116. Then, by using the mask layer as a mask, the conductive layer 116, the tunneling dielectric layer 106 and the substrate 100 are etched to form a plurality of trenches (not shown) in the conductive layer 116, the tunneling dielectric layer 106 and the substrate 100. Thereafter, the isolation structures 102 are formed by filling an insulation material in the trenches. The insulation material filled in the trenches can be silicon oxide.

Figure 2B:
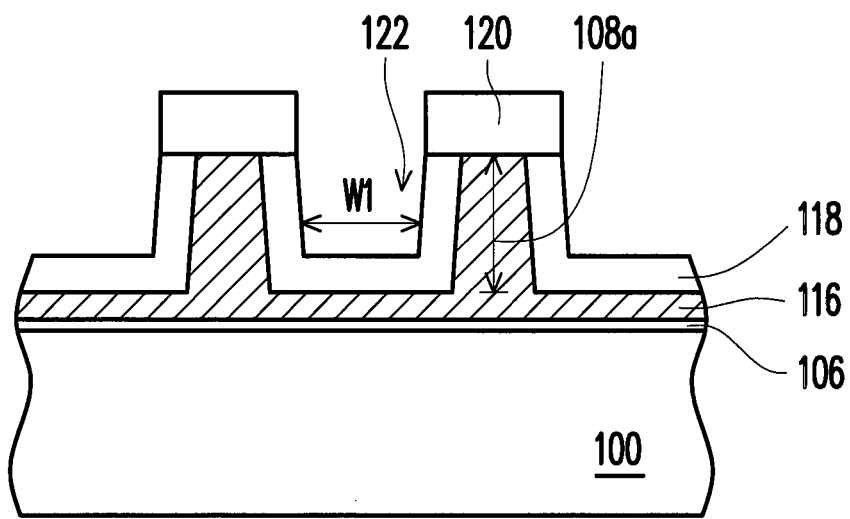
Figure 3B:
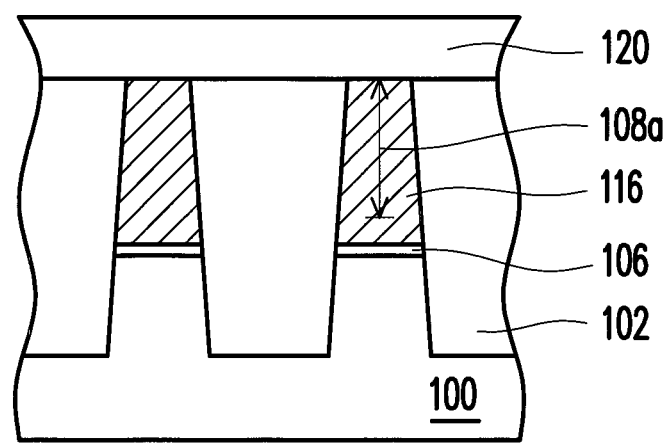

Referring to FIGS. 2B and 3B, a patterned mask layer 120 is formed on the substrate 100. A material of the patterned mask layer 120 is, for example, photoresist or silicon nitride. A method of forming the patterned mask layer 120 includes following steps. First, a photoresist material layer (not shown) is formed on the substrate 100. Then, an exposure process and a development process are performed on the photoresist material layer to form the patterned mask layer 120. In particular, the mask used to form the patterned mask layer 120 can be the same as the mask subsequently used to define the control gate (the word line).

Then, a portion of the conductive layer 116 is removed by using the patterned mask layer 120 as a mask to form a plurality of protruding portions 108a. An opening 122 is formed between the adjacent protruding portions 108a. The opening 122 has a width W1. A surface of the tunneling dielectric layer 106 is not exposed by the openings 122. In other words, the conductive layer 116 disposed at the bottom of the openings 122 still maintains a predetermined thickness. A method of removing the portion of the dielectric layer 116 is a dry etching process, for example.

After that, an oxidized layer 118 is formed over the conductive layer 116 exposed by the openings 122. A method of forming the oxidized layer 118 can be a thermal oxidation process.

Figure 2C:
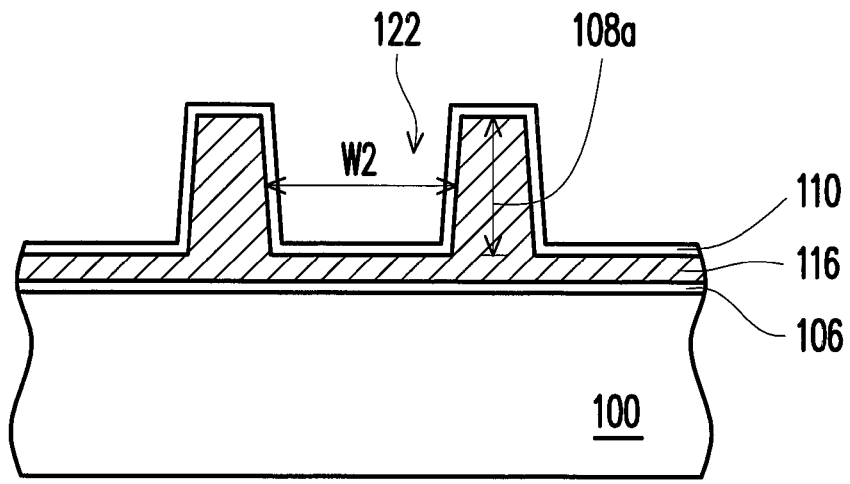
Figure 3C:
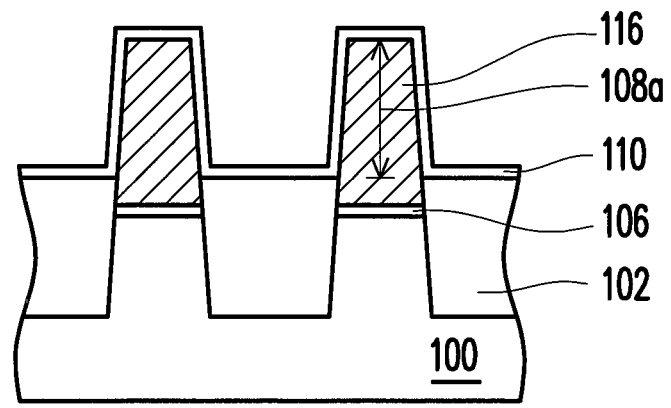

Referring to FIGS. 2C and 3C, the patterned mask layer 120 is removed. A method of removing the patterned mask layer 120 includes performing a wet photoresist removing method or a wet etching process, for example.

Then, the oxidized layer 118 and the isolation structures 102 are partially removed to form the protruding portions 108a. A method of partially removing the oxidized layer 118 and the isolation structures 102 includes performing a dry etching process or a wet etching process by using a hydrofluoric acid as an etchant, for example. After removing the portion of the oxidized layer 118, a width of each of the opening 122 is increased to W2 from W1. In other words, removal of the portion of the oxidized layer 118 increases a distance between the adjacent protruding portions 108a. After removing the portion of the isolation structures 102, a top surface of each of the isolation structures 102 is disposed between a top surface of the conductive layer 116 and a surface of the substrate 100.

According to an embodiment of the invention, a method of removing the portion of the conductive layer 116 to increase the distance between the adjacent protruding portions 108a includes following steps. After the openings 122 are formed, the patterned mask layer 120 is removed directly. Then, a portion of the conductive layer 116 is removed, so that a width of each of the openings 122 is increased to W2 from W1. The method of removing a portion of the conductive layer 116 includes an etching process, such as a dry etching process or a wet etching process. By adjusting the parameters in the dry etching process or the wet etching process, the shape of each of the protruding portions 108a may be sharper, or be a pyramid having an inclined sidewall or a hillock.

After that, an inter-gate dielectric layer 110 is formed on the conductive layer 116. A material of the inter-gate dielectric layer 110 is silicon oxide/silicon nitride/silicon oxide, and a method of forming the same includes forming a silicon oxide layer, a silicon nitride layer and a silicon oxide layer in sequence by using a CVD process or a thermal oxidation process. Certainly, a material of the inter-gate dielectric layer 110 can also be silicon oxide, silicon nitride or silicon oxide/silicon nitride or the similar materials, and a method of forming the same can include performing a CVD process by using different reaction gas depending on the material thereof.

Figure 2D:
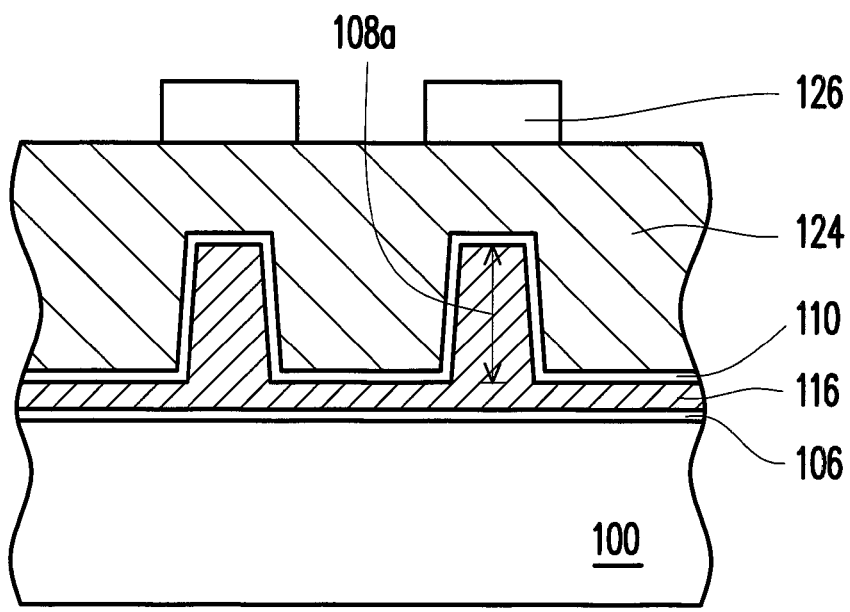
Figure 3D:
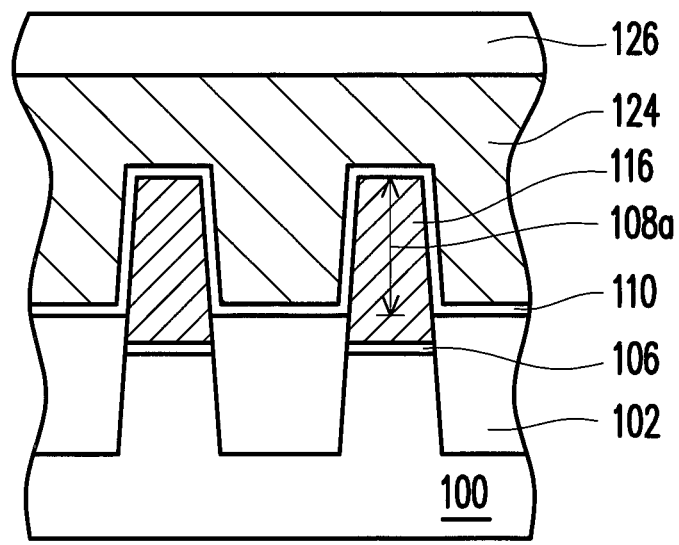

Referring to FIGS. 2D and 3D, a conductive layer 124 is formed on the substrate 100 to fill the openings 122. A material of the conductive layer 124 is the suitable conductive material such as metal, silicide or doped polysilicon. A method of forming the conductive layer 124 includes performing a physical vapor deposition (PVD) process or a CVD process according to the material thereof, for example.

A patterned mask layer 126 is formed on the substrate 100. A material of the patterned mask layer 126 can be photoresist. A method of forming the patterned mask layer 126 includes following steps. First, a photoresist material layer is formed on the substrate 100. Then, an exposure process and a development process are performed on the photoresist material layer to form the patterned mask layer 126. In particular, the mask used to form the patterned mask layer 126 can be the same as the mask subsequently used to define the control gate (the word line).

Figure 2E:
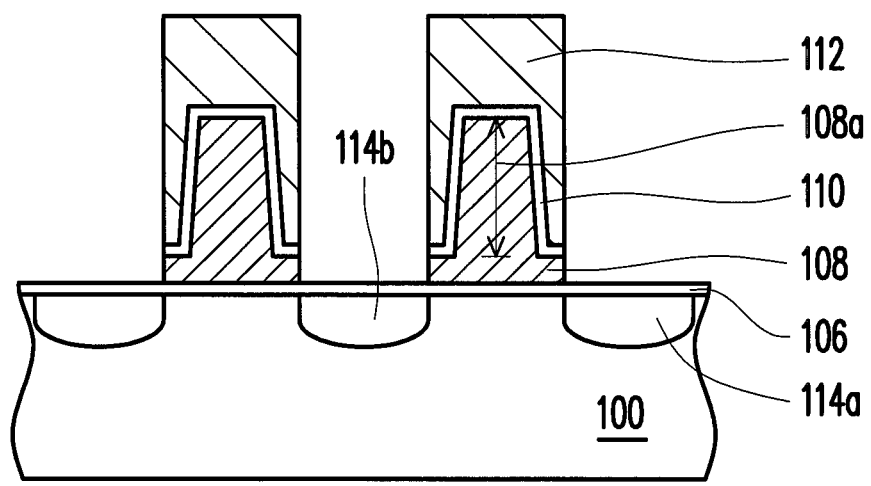
Figure 3E:
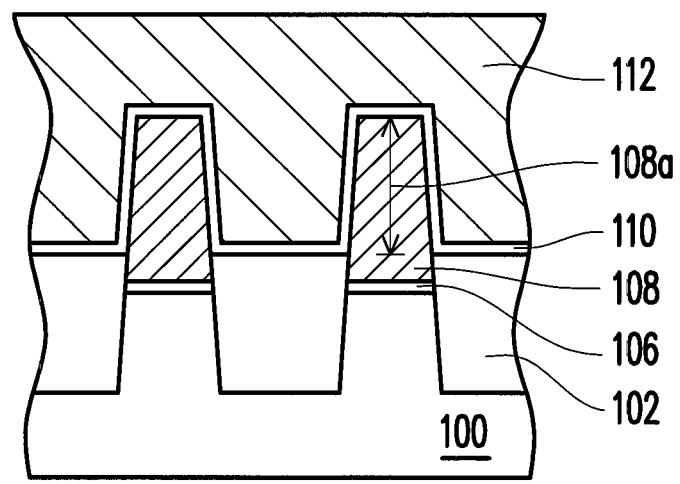

Referring to FIGS. 2E and 3E, by using the patterned mask layer 126 as the mask, the conductive layer 124, the inter-gate dielectric layer 110 and the conductive layer 116 are partially removed to form control gates 112 and floating gates 108. Each of the floating gates 108 has a protruding portion 108a, and protruding portion 108a of the floating gate 108 is fully covered and surrounded by the control gate 112 in any direction, such as an extending direction of the line A-A', an extending direction of the line B-B' or an extending direction of an included angle formed between the line A-A' and the line B-B'. In other words, the protruding portion 108a of the floating gate 108 is covered and surrounded by the control gate 112 in all directions.

After that, a plurality of doping regions 114a, 114b is formed in the substrate 100 at two sides of each of the control gates 112. A method of forming the doping regions 114a, 114b includes performing a dopant implantation process with use of the control gates 112 as the mask. The subsequent process of forming the non-volatile memory is familiar to those skilled in the art and is not described here.

In the fabricating method of a non-volatile memory of the invention, the floating gate 108 having the protruding portion 108a is formed. The protruding portion 108a of the floating gate 108 is fully covered and surrounded by the control gate 112 in any direction, such as an extending direction of the line A-A', an extending direction of the line B-B' or an extending direction of an included angle formed between the line A-A' and the line B-B'. In other words, the protruding portion 108a of the floating gate 108 is covered and surrounded by the control gate 112 in all directions. Thus, the overlapped area between the floating gate 108 and the control gate 112 is increased to enhance the GCR of the memory. Accordingly, the lower operation voltage of the memory is required as the gate coupling ratio is increased, and thus the efficiency of the device is increased. Furthermore, the protruding portion 108a of the floating gate 108 is covered and surrounded by the control gate 112, so as to reduce the interference between the adjacent floating gates 108 in any direction, such as an X direction, a Y direction or an XY direction.

In the fabricating method of a non-volatile memory of the invention, the mask used to form the conductive layer 116 having the protruding portions 108a adapts the same mask for the subsequent formed control gates (word lines), so that additional masks are not required and the manufacturing cost is reduced.

In summary, in the non-volatile memory of the invention, the floating gate has the protruding portion. The protruding portion of the floating gate is fully covered and surrounded by the control gate in any direction, such as an extending direction of a bit line, an extending direction of a word line and an extending direction of an included angle formed between a word line and a bit line. In other words, the protruding portion of the floating gate is covered and surrounded by the control gate in all directions. Therefore, the overlapped area between the floating gate and the control gate is increased to enhance the GCR of the memory. Accordingly, the operation voltage of the memory is lower and the efficiency of the device is increased. In addition, the protruding portion of the floating gate is covered and surrounded by the control gate, so as to reduce the interference between the adjacent floating gates. Furthermore, additional cost for the mask or the equipment is not required in the fabricating method of a non-volatile memory of the invention.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A non-volatile memory, comprising:
a tunneling dielectric layer, disposed on a substrate;
a floating gate, disposed on the tunneling dielectric layer, wherein the floating gate has a protruding portion, and the protruding portion is shaped as a hillock and has an inclined sidewall;
a control gate, disposed above the floating gate to cover and surround the protruding portion in all directions;
an inter-gate dielectric layer, disposed between the floating gate and the control gate; and
a first doping region and a second doping region, respectively disposed in the substrate at two sides of the control gate.

2. The non-volatile memory as claimed in claim 1, wherein a material of the inter-gate dielectric layer comprises silicon oxide/silicon nitride/silicon oxide.

3. The non-volatile memory as claimed in claim 1, wherein a material of the floating gate comprises doped polysilicon.

4. The non-volatile memory as claimed in claim 1, wherein a material of the control gate comprises doped polysilicon or polycide.

5. The non-volatile memory as claimed in claim 1, wherein a material of the tunneling dielectric layer comprises silicon oxide.

* * * * *